United States Patent
Jakobs et al.

(10) Patent No.: US 6,909,657 B2
(45) Date of Patent: Jun. 21, 2005

(54) PSEUDOSTATIC MEMORY CIRCUIT

(75) Inventors: Andreas Jakobs, München (DE);
Thomas Janik, München (DE);
Manfred Menke, Wolfratshausen (DE);
Eckehard Plättner, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/675,433

(22) Filed: Sep. 30, 2003

(65) Prior Publication Data

US 2004/0066686 A1 Apr. 8, 2004

(30) Foreign Application Priority Data

Sep. 30, 2002 (DE) .......................... 102 45 546

(51) Int. Cl.⁷ ................................. G11C 7/00
(52) U.S. Cl. ................... 365/222; 365/236; 365/189.01
(58) Field of Search ............................... 365/222, 236, 365/189.01, 230.06, 233

(56) References Cited

U.S. PATENT DOCUMENTS 6,392,958 B1    5/2002   Lee
6,542,425 B2 *  4/2003   Nam ........................ 365/222
2002/0027821 A1  3/2002  Mizugaki

OTHER PUBLICATIONS

Sawada, K. et al.: "A 30– µA Data–Retention Pseudostatic RAM with Virtually Static RAM Mode", IEEE Journal of Solid–State Circuits, vol. 23, No. 1, Feb. 1988, pp. 12–19.

* cited by examiner

Primary Examiner—David Lam
(74) Attorney, Agent, or Firm—Laurence A. Greenberg; Werner H. Stemer; Ralph E. Locher

(57) ABSTRACT

A psuedostatic memory circuit is selected by a memory selection signal. A control circuit, in a first operating mode, carries out a refresh of the memory area at a refresh address after reception of the refresh request signal by generation of a refresh signal if the memory circuit is deselected or if, in the event of selection of the memory circuit by the memory selection signal, the access to the memory area is ended before the generation of a further refresh request signal. The control circuit, in a second operating mode, interrupts an access to the memory area for the writing and read-out of data and carries out a refresh of the memory area by generation of a refresh signal if the memory circuit is selected and a further refresh request signal is received before the ending of the access to the memory area.

11 Claims, 3 Drawing Sheets

PSEUDOSTATIC MEMORY CIRCUIT

BACKGROUND OF THE INVENTION

Field of the Invention

The invention relates to a memory circuit, in particular a pseudostatic memory circuit. The invention furthermore relates to a method for operating a memory circuit.

Pseudostatic memory circuits are utilized for example in low power applications for future mobile telephones. A large number of functionalities having a high memory requirement are realized in these mobile telephones. The high memory requirement arises for example as a result of video or image representation and also as a result of Internet capability.

Static random access memories (SRAMs) have hitherto been used in these devices in order to cover the memory requirement.

SRAMs have a comparatively high current consumption and will be replaced in the future by so-called pseudostatic memories (PSRAMs). A PSRAM is a DRAM memory that is operated like a static memory. For the same memory density, PSRAMs have a much smaller chip area and, moreover, require less electrical energy for storing data.

Therefore, one goal has been to develop PSRAMs such that they can replace the SRAMs that are used in present-day systems. In this case, the system environment (interfaces, signal configurations) shall preferably remain unchanged so that complex adaptations can be avoided.

Since pseudostatic memories are based on DRAM architectures, i.e. they have dynamic memory cells, the memory cells have to be refreshed in order to retain the memory information as in a normal DRAM memory. In conventional DRAM memories, the refresh operation is controlled by the system environment and not by the DRAM memory. This is not the case with conventional SRAMs. For this reason, PSRAMs must have a dedicated refresh unit by which the memory cells of the PSRAM can be refreshed independently in order to retain the memory information.

Furthermore, it is necessary to provide a refresh controller that ensures that no collision occurs between an internally generated refresh access and an external read/write access. The refresh controller additionally has to ensure that an internal refresh operation does not restrict the functionality. The refresh should be invisible to the user or to the system environment, i.e. not be brought about by a restriction of the functionality.

Such a refresh controller is possible only with restrictions, however, because usually specific SRAM accesses are possible which inevitably entail a violation of the refresh period. The refresh period is determined from the number of cells and the architecture of the memory and determines the time in which a memory cell must be refreshed again in order that the information stored therein is not lost.

In order, then, for a PSRAM to behave like an SRAM, a refresh request can be attended to only when there is a restriction with regard to the read/write accesses initiated by the user or by the system environment. In normal operation, a refresh can be executed only when the memory circuit is deselected. A memory circuit is usually deselected if no read and write accesses to the memory circuit are performed. The memory circuit is usually selected by a memory selection signal.

If the memory circuit is kept active, i.e. selected, for a relatively long time, the following problem arises: after the refresh period has elapsed, a refresh request is output to the controller of the PSRAM. This cannot be processed, however, because the memory circuit is still active, i.e. an access is underway, or an access that is not permitted to be interrupted by a refresh access can be started at any time. After a further refresh period has elapsed, a further refresh request is made, which likewise cannot be processed as long as the memory circuit is selected. Therefore, the refresh requests can accumulate. Loss of information is imminent in the meantime since some or all of the memory cells can lose their information.

If the memory circuit is then deselected, it is possibly the case that not all of the refresh requests can be processed before a renewed read/write access is started. The consequence once again is that the refresh operations are not executed with the required refresh period, and data are thus lost.

PSRAMs are thus compatible with SRAMs under only specific restrictions. In other words, a disadvantage arises for PSRAMs because they cannot be used in all systems without additional technical outlay.

This problem has been avoided hitherto by defining specific additional restrictions (timing parameters) in the specifications for PSRAMs. If these restrictions are complied with, the DRAM memory situated in the PSRAM is guaranteed to be refreshed at regular intervals, so that no information is lost. Such restrictions may be, by way of example, the maximum time in which the memory circuit is selected, the time within which an address change with a new row address must have taken place, and the minimum time for an active write signal.

SUMMARY OF THE INVENTION

It is accordingly an object of the invention to provide a pseudostatic memory circuit that overcomes the above-mentioned disadvantages of the prior art devices of this general type, in which no restrictions have to be complied with by the user or the system environment.

With the foregoing and other objects in view there is provided, in accordance with the invention, a memory circuit. The memory circuit contains memory areas selected by a memory selection signal, and a control circuit connected to and refreshing the memory areas in accordance with a refresh request signal. The control circuit, in a first operating mode, carries out the refreshing of one of the memory areas at a refresh address after receiving the refresh request signal and generating a refresh signal if an addressed memory area has been deselected or if, in an event of selection of the addressed memory area by the memory selection signal, access to the addressed memory area has ended before generation of a further refresh request signal. The control circuit, in a second operating mode, interrupts the access to the addressed memory area for writing and reading-out of data and carries out the refreshing of the address memory area by generating the refresh signal if the addressed memory area has been selected and the further refresh request signal has been received before an ending of the access to the addressed memory area after receiving the refresh request signal.

The invention provides the memory circuit, in particular as a pseudostatic memory circuit, which can be selected by the memory selection signal. The memory circuit has memory areas and a control circuit in order to refresh a memory area of the memory circuit in accordance with a refresh request signal. In a first operating mode the control circuit carries out a refresh of the memory area at a refresh address after reception of the refresh request signal by generation of a refresh signal if the memory circuit is deselected or if, in the event of selection of the memory circuit by the memory selection signal, the access to the memory area is ended before the generation of a further refresh request signal. In a second operating mode the control circuit interrupts an access to the memory area for the writing and read-out of data and carries out a refresh of the memory area by generation of a refresh signal if the memory circuit is selected and a further refresh request signal is received before the ending of the access to the memory area.

The control circuit for the memory circuit thus provides for the possibility of distinguishing between two operating modes. In the first operating mode, a refresh request is attended to only when the memory circuit is deselected or an access that allows processing of a refresh access without restriction to the normal read/write operation is started.

If the memory circuit is not deselected within a refresh period and the access to the memory area is still underway, it is also not possible to execute a refresh. As soon as a second refresh request signal accumulates, the control circuit switches over to the second operating mode. A refresh operation is then inserted independently of the present access. In other words, a present access is interrupted and a refresh of the respective memory area is carried out. A return is made to the first operating mode when the accumulated refresh requests have been processed in accordance with the refresh request signal and the further refresh request signal.

In this way, it is possible to provide a memory circuit that can be operated without any restrictions with regard to timing. This is because if the memory circuit is operated in such a way that refresh requests can be processed essentially near to the time of an incoming refresh request signal, then the memory circuit operates in normal operation. The memory circuit is transferred into a slow mode, that is the second operating mode, if the accesses to the memory circuit are such that it is not possible to perform a refresh operation between the individual accesses to the memory circuit.

Refresh operations can generally be inserted between write or read accesses if the row address is changed. It is not possible to insert refresh operations if memory cells within a row, i.e. within a word line, are accessed.

It may be provided that the control circuit contains a refresh circuit in order to refresh memory areas at predetermined refresh addresses depending on the refresh signal for the purpose of retaining the stored information.

It is preferably provided that the control circuit has a refresh request counter, which can be incremented by the refresh request signal, and a refresh control circuit in order to generate the refresh signal depending on the counter reading of the refresh request counter.

The refresh request signal is preferably generated by a refresh request circuit, which is connected to the refresh request counter, at predetermined times. In this way, the refresh operations can be requested at regular time intervals.

The refresh control circuit generates a refresh signal if a refresh request signal has been received and the memory circuit is deselected or, in the event of selection of the memory circuit by the memory selection signal, a refresh of the memory area at a refresh address is possible during an access to the memory circuit. A refresh signal is likewise generated if the memory circuit is selected and a further refresh request signal is received before the ending of the access to the memory area.

The refresh request counter is preferably suitable for transmitting a first refresh counter signal and a second refresh counter signal to the refresh control circuit. The first refresh counter signal specifies when a refresh request signal has been received by the refresh request counter. The second refresh counter signal is generated when a further refresh request signal has been received in the refresh request counter. The refresh request counter thus generates a first and a second refresh counter signal that corresponds to the number of refresh request signals that have not yet been processed.

The memory area preferably corresponds to one or a plurality of word lines of the memory circuit. While no refresh operation is possible between accesses to memory cells which lie within a word line, a refresh at a different word line address is possible in the event of accesses to memory cells wherein the word line is changed.

A further aspect of the present invention provides a method for operating a memory circuit. In this case, in a first operating mode a refresh of a memory area at a refresh address is carried out after reception of a refresh request signal. The first operating mode is assumed under the condition that the memory circuit is deselected or that, in the event of a selection of the memory circuit, the access to the memory area is ended before the reception of a further refresh request signal. In a second operating mode an access to the memory area for the writing and read-out of data is interrupted and a refresh of the memory area is carried out if the memory circuit is selected and a further refresh request signal is received before the ending of the access to the memory area after a refresh request signal.

Other features which are considered as characteristic for the invention are set forth in the appended claims.

Although the invention is illustrated and described herein as embodied in a pseudostatic memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
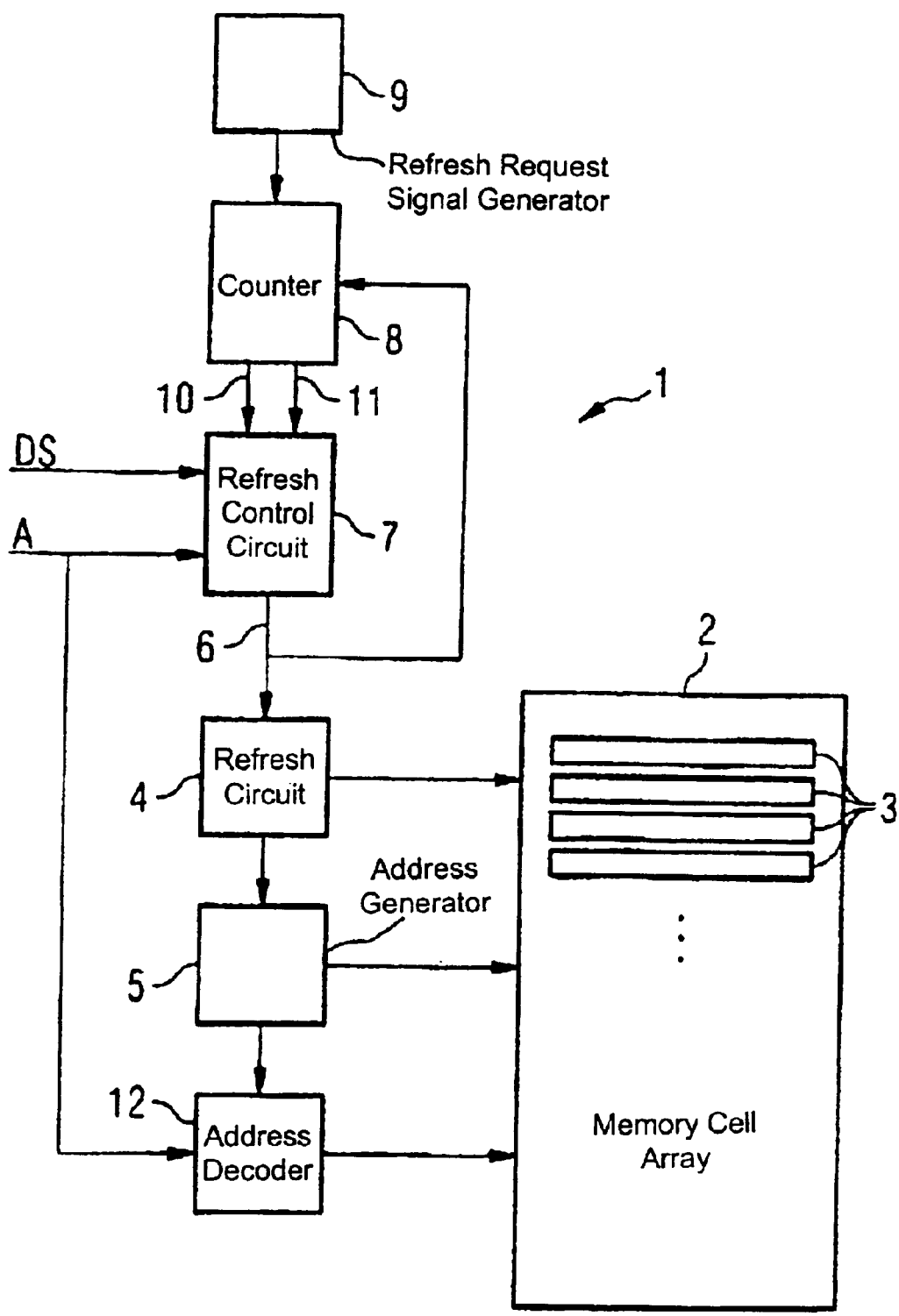
FIG. 1 is a block diagram of a preferred embodiment of a memory circuit according to the invention.

Referring now to the figures of the drawing in detail and first, particularly, to FIG. 1 thereof, there is shown a memory circuit that has a control circuit 1 and a memory cell array 2 subdivided into memory areas 3. The memory cell array 2 has non-illustrated dynamic memory cells which have to be refreshed at regular time intervals in order that leakage currents do not cause the charge of the storage capacitances contained in the memory cells to flow away and a loss of information thus to occur.

The refresh of the memory cells is performed with the aid of a refresh circuit 4 connected to the memory cell array 2. The refresh circuit 4 is connected to a refresh address generator 5, which generates the refresh addresses that specify the memory area to be refreshed. If the refresh circuit 4 receives the refresh signal via a refresh signal line 6, then a refresh operation is started in the memory cell array 2. The refresh operation is carried out in a memory area 3 specified by the refresh address prescribed by the refresh address generator 5.

The refresh address generator 5 is preferably configured in such a way that the refresh address is incremented as soon as a refresh signal is forwarded to the refresh address generator 5 by the refresh circuit 4. Instead of incrementing, it is also possible to provide any other address generating methods, it being necessary to ensure that all possible refresh addresses are run through cyclically, so that each of the memory cells is refreshed before it loses its information.

The refresh signal is generated by a refresh control circuit 7. The refresh control circuit 7 is connected to a refresh request counter 8, which receives a refresh request signal from a refresh request signal generator 9. The refresh request signal generator 9 generates a refresh request signal at predetermined regular intervals in order to indicate that the memory area 3 of the memory cell array 2 is to be refreshed. The regular intervals are dimensioned in such a way that the time for refreshing all the memory areas that are to be refreshed in accordance with a refresh request signal within a time in which the information contained in the memory cells is never lost. The refresh request signal increments the counter reading of the refresh counter 8. The refresh counter 8 is connected to the refresh control circuit 7 by a first refresh counter signal line 10 and a second refresh counter signal line 11. If the refresh counter 8 is incremented, then this is indicated by the first refresh counter signal on the first refresh counter signal line 10. If the refresh counter 8 has already been incremented by 1 and renewed incrementing takes place on account of a further refresh request signal from the refresh request signal generator 9, then a second refresh counter signal is generated, which is communicated to the refresh control circuit 7 via the second refresh counter signal line 11.

The refresh control circuit 7 generates a refresh signal in order, with the aid of the refresh circuit 4, to directly carry out a refresh operation depending on the number of accumulated refresh request signals in the refresh counter 8. The refresh signal is generated if a first refresh counter signal has been received by the refresh control circuit 7 and if the memory circuit is deselected in accordance with a memory selection signal or if the first refresh counter signal has been received and, in the event of selection of the memory circuit by a memory selection signal DS, during an access to the memory cell array, it is possible to refresh the memory area 3 at a refresh address.

If a refresh signal has been generated, then it is conducted via the refresh signal line 6 to the refresh request counter 8 in order to decrement the latter. It is thereby indicated in the refresh request counter 8 that the refresh request signal has led to a refresh signal and a refreshing of one of the memory areas has thus been performed.

The memory cell array has non-illustrated memory cells that can be addressed via word lines and bit lines. In the event of addressing of a memory cell, the word line is activated, after which the charges of the memory cells flow onto the respective bit lines and the charges, after being amplified in the sense amplifiers, can be read out as data via the bit lines. The writing and reading of data on memory cells lying within one word line does not require renewed activation of the word line and is therefore considerably faster than the writing and reading of data lying on different word lines. This is because before a memory cell on a word line can be accessed, the respective word line is activated. The activation is effected only once in the event of accesses to memory cells of one word line, before the access to the memory cells of the word line begins. If a memory cell on another word line is accessed, the previous word line is deactivated and the new word line is activated. It is possible to carry out a refresh operation between the deactivation of the previous word line and the activation of the new word line.

For this reason, in the same way as an address decoder 12 via which word lines and bit lines can be addressed, the refresh control circuit 7 is also connected to the address lines for the addressing of the memory cell array 2. The refresh control circuit 7 is thus able to ascertain whether a refresh signal is permitted to be transmitted to the refresh circuit 4 via the refresh signal line 6 without interrupting an access to the memory cells of a word line. The refresh signal is thus transmitted when, after a reception of the first refresh counter signal, the memory circuit remains selected by the selection signal DS and, after the reception of the first refresh counter signal, an address change which requires the activation of a new word line is effected.

The refresh control circuit 7 always transmits a refresh signal via the refresh signal line 6 to the refresh circuit 4 if a second refresh counter signal has been received via the second refresh counter signal line 11, which signal indicates that a further refresh request signal has arrived in the refresh counter 8 without the previous refresh request signal having been able to be processed. In this case, the refresh signal is transmitted even when memory cells situated along a word line are accessed. The transmission of the refresh signal to the refresh circuit 4 immediately interrupts the read/write operation to the memory cell array 2 and carries out the refresh. This is done by ending the current read or write access to a memory cell, i.e. deactivating the relevant word line and then activating a word line for the refresh and then deactivating it. Only then can the read/write access to the memory cell array 2 be continued by activation of the original or of a new word line.

A return is then made to the first operating mode if no further refresh request signal arrives in the refresh counter 8 in the meantime. The system remains in the second operating mode, however, if a further refresh request signal arrives in the meantime.

In this way, the control of the PSRAM is extended in such a way that two operating modes can be distinguished. The operating modes are normal operation and a slow operation. In normal operation, a refresh request is attended to only when the chip is deselected or an access that permits a processing of a refresh access without restriction to the normal read/write operation is started. If the memory circuit is not deselected within the refresh period and no change to the word line is made either during the access to the memory cell array, no refresh operation is executed either. As soon as a second refresh request signal accumulates, however, the refresh control circuit 7 switches over to slow operation. A refresh operation is then inserted independently of the present access. A return is then made to normal operation again if no further refresh request signal has arrived in the meantime.

Under specific assumptions that are expedient in applications, an interruption of a read/write access, initiated by the switchover to slow operation, does not lead to any restrictions for the user or for the system environment in which the memory circuit is operated. In other words, valid data are read out in the event of a read access and data are written correctly in the event of a write access. In this case, no data whatsoever are lost nor are incorrect data read or written.

Figure 2:
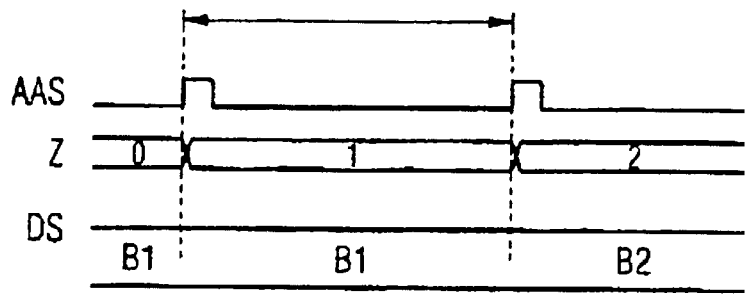
FIG. 2 is a signal timing diagram that illustrates the condition in the transition to a second operating mode.

FIG. 2 illustrates the signal profiles in the event of a switchover from normal operation B1 to slow operation B2. The upper signal corresponds to the refresh request signal AAS, which is generated in the form of a short pulse, by the refresh request signal generator 9. The refresh period is 30 ns, for example, in which a short pulse is generated in each case. The refresh request signal increments the refresh counter 8, the counter reading of which is illustrated as a second signal Z. The memory selection signal DS is illustrated as a third signal, the memory circuit being selected if the memory selection signal is in the low state.

The refresh control circuit 7 is originally in the normal operation B1 and remains in normal operation if the counter reading of the refresh counter 8 has been set to "1" by the first refresh request signal AAS. Only if the counter reading is not decremented by the refresh signal of the refresh control circuit 7 and a further refresh request signal arrives, so that the counter reading increases to "2", is a switchover made to the second operating mode B2, slow operation.

Figure 3:
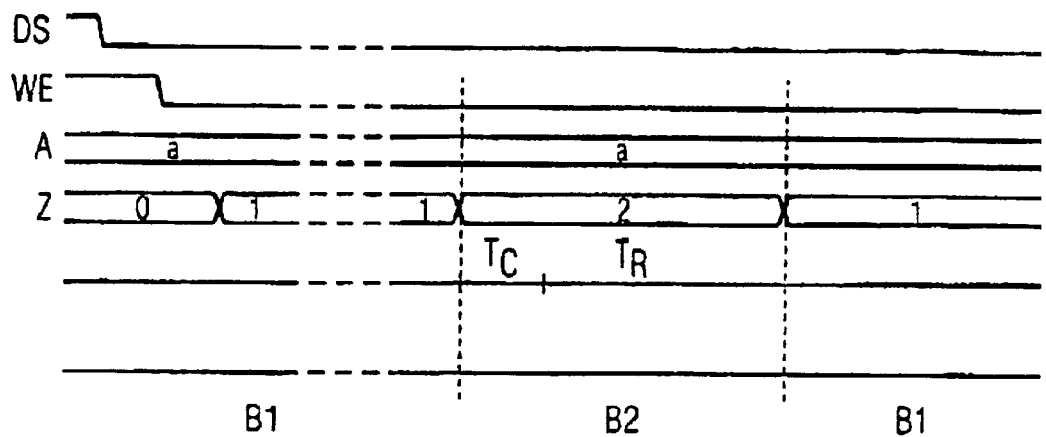
FIG. 3 is a signal timing diagram that illustrates the condition in the transition from the second to a first operating mode without a word line address change.

FIG. 3 illustrates how a switchover is made to the slow operation B2 and a return is made to the normal operation B1 if the word line address is not changed during slow operation B2. The upper signal is the memory selection signal DS, which changes to the low state at the beginning, as a result of which the memory circuit is selected. The subsequent signal is a write access activation signal WE, which is transmitted before a write access to memory cells of a word line. The write access activation signal WE activates a word line if it is in the low state.

The subsequent signal specifies the address A that is present, which address may change depending on the accessed memory cell during an activated word line. The fourth signal shows the counter reading of the refresh counter 8.

Time segments in which the memory activity is designated are specified below. The word line specified by the address is activated with the falling edge of the write access activation signal WE. Refresh request signals that then accumulate then increment the refresh counter 8. The broken lines illustrate a normal operation of the memory circuit, in which the word lines are deactivated and activated again by the write access activation signal at shorter intervals than a refresh period. The memory circuit is in normal operation B1. If the counter reading Z of the refresh counter 8 is at "1" and one of the word lines is activated on account of a write access activation signal and a further refresh request signal AAS is issued, then the counter reading of the refresh counter 8 changes to "2". Therefore, two refresh request signals have accumulated without having been able to be processed. In this case, the word line is closed within time $T_C$ even though possibly further memory cells on the word line are intended to be written to. After the word line has been closed, the refresh operation is carried out within the time $T_R$, for which purpose the refresh control circuit 7 generates a refresh signal. The refresh signal decrements the refresh counter 8. If the refresh counter has the value "1" after the end of the refresh operation in the memory cell array 2, in other words no further refresh request signal AAS has been generated during the refresh operation, i.e. during the times $T_R$ and $T_C$, then the memory circuit is operated further in the normal operation B1. In other words, the previously addressed word line is activated again in order to continue the write operation at the remaining memory cells.

Figure 4:
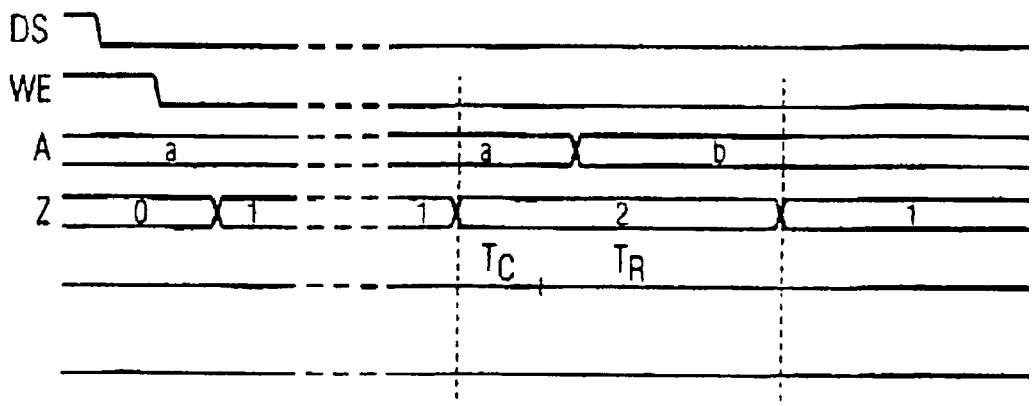
FIG. 4 is a signal timing diagram which illustrates the condition in the transition from the second to the first operating mode with a word line address change.

FIG. 4 illustrates a timing diagram similar to FIG. 3. It differs by the fact that a new address A is applied during the refresh operation. In this case, after the end of the refresh operation, the new word line is activated in accordance with the new address in order to continue the write operation on the new word line. The timing profiles specified in FIGS. 2 to 4 also essentially apply to read accesses.

The use of such a memory circuit is advantageous for the application environment, and, under specific expedient assumptions, an interruption of a read/write access, initiated by the switchover to slow operation B2, does not lead to any restrictions for the user.

In normal operation, a processor generates commands, addresses and data at a specific frequency that is much greater than the refresh rate, i.e. 1/refresh period, of the PSRAM. Specific commands permit the insertion of a refresh access. By way of example, the deselection of the memory circuit with the aid of the signal DS=1 allows an internal refresh access to be started. Further commands are e.g. reading/writing to a new PSRAM word line address, in which case, when the word line address is changed, a refresh operation can likewise be executed in a manner invisible to the user. The time required for this is usually admitted by the system environment. The normal operation thus allows the processing of a refresh access within the required refresh period.

In slow operation, the processor generates commands, data and addresses at a frequency that is less than the required refresh rate. The read/write data are likewise transmitted or expected at this frequency. Since a refresh access lasts approximately 30 ns, i.e. has proportionally a much shorter duration than a read/write access, which lasts approximately 10 μs, a read/write access can always be begun or concluded correctly.

One goal of creating such a PSRAM is to provide a memory circuit that is essentially compatible with a conventional static memory. Such a PSRAM can be used without necessitating an additional hardware and/or software adaptation for the substitution of static memories in existing systems. Furthermore, it is not necessary to provide additional timing restrictions in the specification of the memory circuit for ensuring the refresh period.

Figure 5:
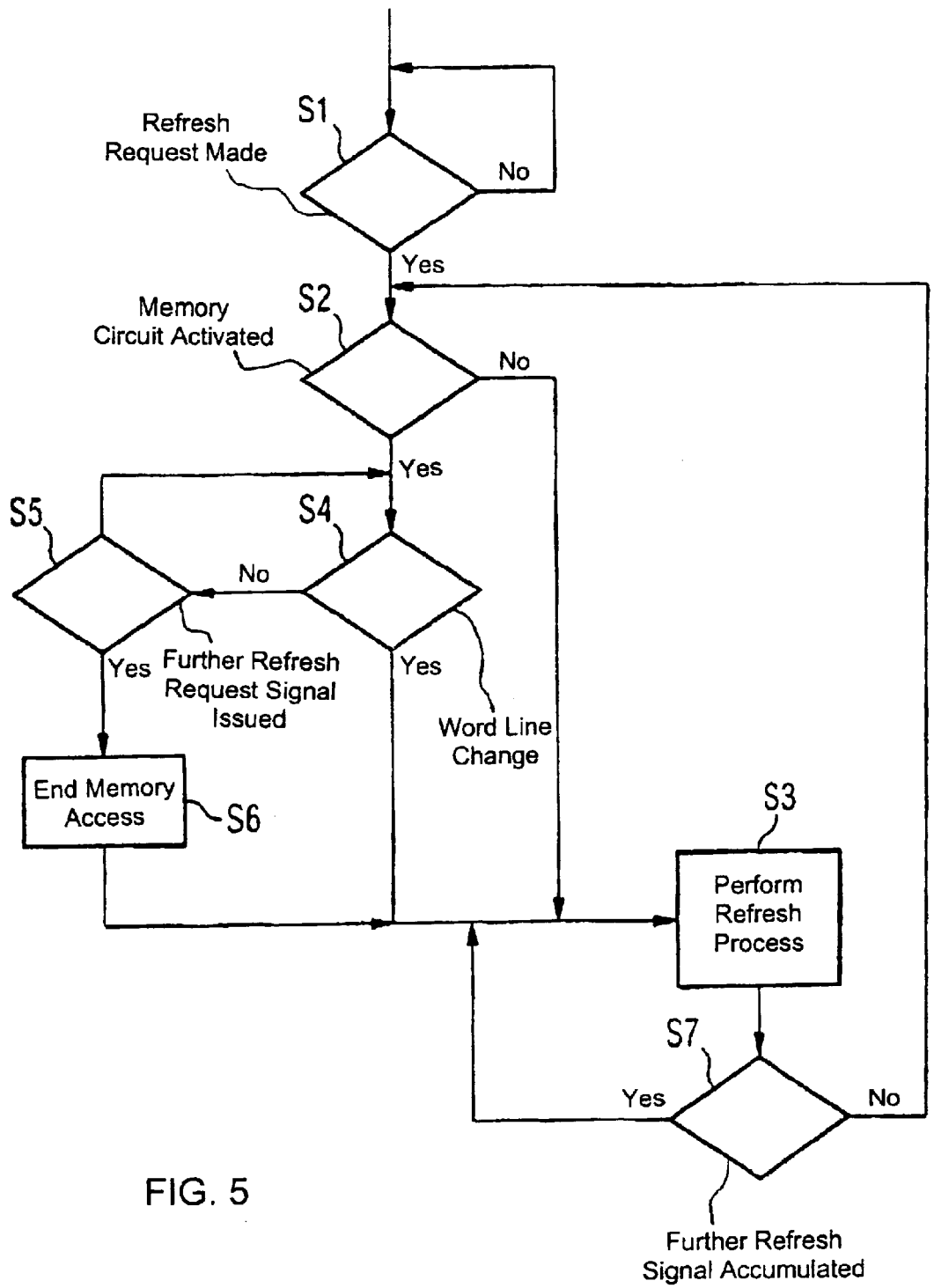
FIG. 5 is a flow diagram for illustrating the method according to the invention.

FIG. 5 shows a flow diagram of the method according to the invention. Interrogation as to whether a refresh request has been made is effected in an interrogation step S1. The interrogation is carried out until the refresh request signal has been generated. A second interrogation step S2 is carried out to ascertain whether or not the memory circuit is activated by the memory selection signal DS. If the memory circuit is not activated, then the refresh is carried out in accordance with a refresh signal in a step S3. If the refresh request signal is affected while the memory circuit is selected, then an interrogation step S4 is carried out to ascertain whether the word line is changed during read or write accesses. If the word line is changed, then after the deactivation of the word line, the refresh is carried out in accordance with the refresh address in step S3. If the word line is not changed during the access to the memory circuit, then interrogation step S5 is carried out to ascertain whether a further refresh request signal has been issued. The interrogation in respect of the change in the word line address is carried out either until the word line address has been changed or until a further refresh request signal has been issued. If a further refresh request signal has been issued, then the present memory access is ended by closing the word line in a step S6. Afterward, the refresh operation is carried out in accordance with step S3.

If a further refresh request signal has accumulated during the refresh operation in step S3, then a refresh is also carried out in accordance with the new refresh request signal without permitting a further memory access. If no further refresh request signal has accumulated in the interrogation step S7, then the method jumps back to interrogation step S2 since the refresh counter reading only indicates one accumulated refresh request signal.

We claim:

1. A memory circuit, comprising:
    memory areas selected by a memory selection signal; and
    a control circuit connected to and refreshing said memory areas in accordance with a refresh request signal, said control circuit:
        in a first operating mode, carrying out the refreshing of one of said memory areas at a refresh address after receiving the refresh request signal and generating a refresh signal if an addressed memory area has been deselected or if, in an event of selection of said addressed memory area by the memory selection signal, access to said addressed memory area has ended before generation of a further refresh request signal;
        in a second operating mode, interrupting the access to said addressed memory area for writing and reading-out of data and carrying out the refreshing of said address memory area by generating the refresh signal if said addressed memory area has been selected and the further refresh request signal has been received before an ending of the access to said addressed memory area after receiving the refresh request signal.

2. The memory circuit according to claim 1, wherein said control circuit contains a refresh circuit for refreshing said memory areas at predetermined refresh addresses depending on the refresh signal for retaining stored information.

3. The memory circuit according to claim 1, wherein said control circuit includes:
    a refresh request counter being incremented by the refresh request signal; and
    a refresh control circuit generating the refresh signal in dependence on a counter reading of said refresh request counter.

4. The memory circuit according to claim 3, wherein said control circuit has a refresh request circuit connected to said refresh request counter for generating the refresh request signal at predetermined times.

5. The memory circuit according to claim 3, wherein said refresh control circuit generates the refresh signal if the refresh request signal has been received and said address memory area is deselected or, in an event of selection of said addressed memory area by the memory selection signal, the refreshing of said addressed memory area at the refresh address is possible during the access to said address memory area, or if said addressed memory area is selected and the further refresh request signal is received before an ending of the access to said addressed memory area.

6. The memory circuit according to claim 3, wherein said refresh request counter transmits a first refresh counter signal and a second refresh counter signal to said refresh control circuit.

7. The memory circuit according to claim 3, wherein said refresh control circuit is connected to said refresh request counter for decrementing said refresh request counter in an event of the generation of the refresh signal.

8. The memory circuit according to claim 1, wherein said memory areas have word lines.

9. The memory circuit according to claim 1, wherein the memory circuit is a psuedostatic memory circuit.

10. A method for operating a memory circuit, which comprises the steps of:
    carrying out a refreshing process in a first operating mode for refreshing a memory area at a refresh address after receiving a refresh request signal if the memory area is deselected or if, in an event of a selection of said memory area, an access to the memory area is ended before a reception of a further refresh request signal; and
    interrupting, in a second operating mode, the access to the memory area for writing and reading-out of data and performing the refreshing process of the memory area if the memory area is selected and the further refresh request signal is received before an ending of the access to the memory area.

11. The method for operating the memory circuit according to claim 10, which further comprises providing a pseudostatic memory circuit as the memory circuit.

* * * * *